(12) United States Patent
Shinosawa et al.

(10) Patent No.: US 6,558,821 B1
(45) Date of Patent: May 6, 2003

(54) CERAMIC SINTER, AND WEAR RESISTANT MEMBER AND ELECTRONIC COMPONENT MEMBER USING THEREOF

(75) Inventors: Katsuhiro Shinosawa, Yokohama (JP); Hiroyasu Ohta, Yokohama (JP); Mineyuki Yamaga, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/531,161

(22) Filed: Mar. 17, 2000

(30) Foreign Application Priority Data

Mar. 26, 1999 (JP) .............................. 11-084956

(51) Int. Cl.⁷ ................................. B32B 9/00
(52) U.S. Cl. ................... 428/698; 428/699; 428/701; 428/702; 501/88; 501/965; 501/97.1; 501/98.1; 501/103
(58) Field of Search ................ 428/469, 698, 428/699, 702, 701; 501/97, 98, 104, 88, 96.5, 97.1, 98.1, 103; 384/625, 907.1; 277/943

(56) References Cited

U.S. PATENT DOCUMENTS

| | | | |
|---|---|---|---|
| 4,106,782 A | 8/1978 | Hyde et al. | |
| 4,738,885 A | 4/1988 | Matsumoto | |
| 5,017,531 A | * 5/1991 | Ukai ........................ | 501/98 |
| 5,259,675 A | 11/1993 | Ichikawa et al. | |
| 5,508,241 A | * 4/1996 | Yeckley .................... | 501/97 |
| 5,584,745 A | * 12/1996 | Nishioka et al. ............. | 451/28 |
| 5,850,329 A | 12/1998 | Sullivan | |

FOREIGN PATENT DOCUMENTS

| EP | 0 567 686 | 11/1993 |
|---|---|---|
| JP | 3-249428 | 11/1991 |
| JP | 4-175511 | 6/1992 |
| JP | 4-347076 | 12/1992 |
| JP | 5-163909 | 6/1993 |
| JP | 7-119830 | 5/1995 |
| JP | 7-197236 | 8/1995 |
| JP | 10-103356 | 4/1998 |
| JP | 2891988 | 2/1999 |

OTHER PUBLICATIONS

JIS (Japanese Industrial Standard) B0660 pp. 614–629. (Partial English Translation).

* cited by examiner

*Primary Examiner*—Deborah Jones
*Assistant Examiner*—Arden Sperty
(74) *Attorney, Agent, or Firm*—Oblon, Spivak, McClelland, Maier & Neustadt, P.C.

(57) ABSTRACT

In ceramic sinter consisting of at least one kind selected from a group consisting of silicon nitride, zirconia, silicon carbide, cermet, SIALON, aluminum nitride and alumina, wear resistant member and electronic component member using thereof, skewness at a contact surface of the ceramic sinter is set at −2 or more and 0 or less, a depth of a micro-crack is set at 5 μm or less, and in the depth of up to 500 μm from the surface an area that pores occupy does not exceed 5%. The ceramic sinter as described above can suppress wear of the opponent member. Further, in such ceramic sinter, bonding strength with an element or a metal plate can be heightened to enable to suppress peeling. The electronic components of high reliability can be fabricated accordingly. The present wear resistant member is suitable for sliding member that is used in portions where wear is particularly remarkable. The present ceramic sinter is suitable for electronic component member such as substrates, heat sinks or the like that tend to peel.

9 Claims, 4 Drawing Sheets

CERAMIC SINTER, AND WEAR RESISTANT MEMBER AND ELECTRONIC COMPONENT MEMBER USING THEREOF

BACKGROUND OF THE INVENTION

1. Field of the Invention

The present invention relates to ceramic sinter suitable for sliding member and wear resistant member using thereof. The present invention relates further to ceramic sinter suitable for electronic components such as substrates or the like and electronic component member using thereof.

2. Description of the Related Art

So far, for wear-resistant member such as cam rollers, bearing balls, check balls, wearing plates and plungers used for industrial machinery and automobiles, metal products have been used much. However, when metal products are used in the places mentioned above, due to friction these components tend to be heavily worn to result in an inability of exhibiting prescribed performance or, when more heavily worn, to result in being damaged. These metal products, being heavy, are unsuitable for lightweight or high performance use. Further, the metal products, being low in heat-resistance and corrosion-resistance, are short of durability under severe circumstances, resulting in being less economic. Accordingly, high performance substitutes for the metal products are in demand.

To solve these problems, in recent years, the ceramic sinter is in use as wear-resistant components. The ceramic sinter, being superior to the metal components in wear-resistance, can maintain the prescribed performance and are not damaged for a long time to result in cost saving. In addition, being lightweight compared with the metal components higher speed rotation can be made possible.

However, when the ceramic sinter described above is used in machinery, though the ceramic sinter itself does not wear, the components in contact with the ceramic sinter tend to be worn on the contrary. Those aforementioned things have caused problems in wear-resistant components used in fuel injectors of such as automobiles, in particular in cam rollers. The reason for this is that hardness of the ceramic sinter is higher than that of the metal components in contact therewith.

To solve these problems, it is considered for all the components to be constituted of the ceramic sinter. However, because of difficulties in machining and less economics, that is not yet in realization. In addition, since the wear of opponent members (members in contact with ceramic sinters) is largely influenced by the surface state of the ceramic sinter, several attempts to improve the surface state thereof were tried. As examples of the above, specifying a distance between adjacent convex portions on the surface as a degree of waviness was tried, which expresses the macroscopic roughness of the surface of the ceramic sinter, for example, to 500 $\mu$m or less, to form micro-cracks on the surface, or to specify a surface roughness to be 0.005 $\mu$m to 0.02 $\mu$m and surface porosity to be 0.5% or more and 8% or less. Though the wear of the opponent member is alleviated due to the above provision of the surface state, the wear of the opponent member is still occurring.

By contrast, in the field of electronic industry, in substrates for mounting high power semiconductor components or the like, a metal plate such as copper plate is bonded onto a ceramic substrate to form a ceramic printed wiring board. The ceramic sinter, being excellent in insulation, heat-resistance and thermal conduction, is preferably used for the substrates and heat sinks.

However, when the ceramic sinter is used as the substrate, bonding strength with metal being poor, peeling and damage tend to occur. Accordingly, the composition and structure of the ceramic sinter are controlled to enhance the bonding strength with the metal, thereby preventing the peeling and damage from occurring. However, these problems are still occurring.

SUMMARY OF THE INVENTION

Accordingly, an object of the present invention is to provide, for general industrial machinery, ceramic sinter and wear resistant member capable of suppressing wear of an opponent as large as possible. Another object of the present invention is to provide, for electronic components or the like, ceramic sinter excellent in bonding with metal and electronic component member using thereof.

A first aspect of the present invention is that skewness of ceramic sinter at a contact surface is −2 or more and 0 or less, and depths of micro-cracks formed on the contact surface are 5 $\mu$m or less.

In addition, in the ceramic sinter, in the range of the depth of up to 500 $\mu$m from the contact surface, an area that pores occupy per unit area (1 mm$^2$) does not exceed 5%.

The ceramic sinter like this preferably consists of at least one kind selected from a group consisting of for instance silicon nitride, zirconia, silicon carbide, cermet, SIALON, aluminum nitride and alumina.

A second aspect of the present invention relates to wear-resistant member. The present wear resistant member is preferable for the ceramic sinter to have hardness Hv of 100 or more and strength of 300 MPa or more.

The wear-resistant member of the present invention consists of ceramic sinter, the skewness of a sliding contact surface of the ceramic sinter with other member being −2 or more and 0 or less, the depths of the micro-cracks at the sliding surface being 5 $\mu$m or less.

The present wear resistant member preferably consists of at least one kind selected from a group consisting of for instance silicon nitride, zirconia, silicon carbide, cermet and SIALON. The present wear resistant member can be preferably used for cam rollers, bearing balls, check balls, wearing plates, plungers or rollers.

The aforementioned wear resistant member is preferable to have hardness Hv of 1300 or more and strength of 600 MPa or more. In addition to this, in the range of a depth up to 500 $\mu$m from the sliding contact surface, an area of pores is preferable not to exceed 5%.

A third aspect of the present invention relates to an electronic component member. The present electronic component member consists of ceramic sinter, the skewness at a bonding surface of the ceramic sinter with other member is −2 or more and 0 or less, the depths of micro-cracks at the bonding surface not exceeding 5 $\mu$m.

The present electronic component member is preferable to be used for substrates, heat sinks or the like for instance. The electronic component member like this is preferable to be consisting of at least one kind selected from a group of for instance aluminum nitride, silicon nitride and alumina. The present electronic component member is preferable to have thermal conductivity of 130 W/m·K or more.

In the present electronic component member, for instance a metal plate can be directly bonded or by use of other method to a bonding surface to use. In the present electronic component member, the skewness at the bonding surface is more preferable to be −1 or more and 0 or less, the depths of the micro-cracks not exceeding 5 μm.

In the present ceramic sinter, the skewness at the contact surface is set at −2 or more and 0 or less, the depths of the micro-cracks formed on the contact surface at 5 μm or less. Thereby, the ceramic sinter can be prevented from wearing itself and an opponent member. Such effects can be obtained particularly when the opponent member consists of metal that is subject to wear compared with the ceramic sinter. The present ceramic sinter, when the skewness at the contact surface is −2 or more and 0 or less and the depths of the micro-cracks formed on the contact surface are 5 μm or less, can enhance bonding with elements and metal plates.

In the present ceramic sinter, in the range of the depth of up to 500 μm from the contact surface, an area that pores occupy is made not to exceed 5%. Thereby, the ceramic sinter itself can be improved in its strength and the opponent member can be suppressed from wearing. In the range of up to 500 μm from the contact surface, the area that pores occupy can be made not to exceed 5%, thereby the bonding at the contact surface being improved.

As materials that constitute such ceramic sinter, at least one kind selected from a group of silicon nitride, zirconia, silicon nitride, cermet, SIALON, aluminum nitride and alumina can be used. Thereby, the ceramic sinter of excellent strength and thermal conduction can be fabricated with ease.

In the present wear resistant member, the skewness of the sliding contact surface that tends to wear other members due to sliding against the other member in particular is set at −2 or more and 0 or less. Thereby, wear of the other member consisting of metal or the like can be remarkably reduced. As materials of such wear resistant member, at least one kind selected from a group of silicon nitride, zirconia, silicon carbide, cermet and SIALON can be used. Thereby, the strength and toughness of the wear resistant member can be secured, wear of the wear resistant member itself can be suppressed, and the wear resistant member can be fabricated with ease.

The aforementioned wear resistant member can be used for the member such as for instance cam rollers, bearing balls, check balls, wearing plates, plungers and rollers that rub against each other with high-speed to tend to wear the opponent. Thereby, machinery using thereof can be prevented from damaging and performance deterioration can be suppressed from occurring. In order to use for the above purpose, the present wear resistant member is preferable to have hardness Hv of 1300 or more and strength of 600 MPa or more. In the present wear resistant member, the skewness at the sliding contact surface is set at −1 or more and 0 or less, the depths of the micro-cracks not exceeding 1 μm. Thereby, wear of the other member can be further suppressed.

In the present electronic component member, the skewness of the surface that bonds components or circuitry in particular is set at −2 or more and 0 or less and the depths of the micro-cracks at not exceeding 5 μm. Thereby, bonding strength between the components and circuitry can be heightened. The electronic component member like this can be used for the member that is subject to expose to vehement temperature variation, such as substrates and heat sinks in particular. Thereby, peeling and damage due to thermal stress can be suppressed.

For an electronic component member like this, at least one kind selected from a group of for instance aluminum nitride, silicon nitride and alumina can be used. Thereby, characteristics such as strength and thermal conduction can be controlled. The present electronic component member, when used for the substrates, heat sinks or the like, is preferable to have thermal conductivity of 60 W/m·K or more, more preferable being 130 W/m·K or more. The present electronic component member can be directly bonded to the metal plates or the like, resulting in enhancement more than ever of bonding strength. In the present electronic component member, the skewness at the bonding surface is made −1 or more and 0 or less, and the depths of the micro-cracks are made not to exceed 1 μm. Thereby, bonding strength can be further enhanced.

DESCRIPTION OF THE PREFERRED EMBODIMENTS

In the following, modes for implementing the present invention will be explained.

The ceramic sinter of the present invention is characterized in that skewness at a contact surface is −2 or more and 0 or less and depths of micro-cracks at the contact surface are 5 μm or less.

The skewness (Sk) is a parameter of surface roughness and can be called as warp. The skewness is a value that expresses symmetric property in a depth magnification direction of an amplitude distribution curve of the surface roughness and the value thereof can be obtained by the following equation.

$$Sk = \frac{1}{(Rq)^3} \times \frac{1}{n}\sum_{i=1}^{n}(Yl - \overline{Y})^3 \qquad [\text{Equation 1}]$$

Here, Rq is root mean square roughness.

$$Rq = \left(\frac{1}{l}\right)\int_0^l f(x)^2 \, dx \qquad [\text{Equation 2}]$$

Figure 1A:
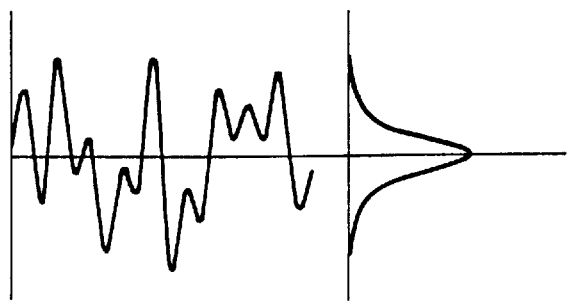
FIG. 1A, FIG. 1B and FIG. 1C are diagrams for explaining skewness.
Figure 1B:
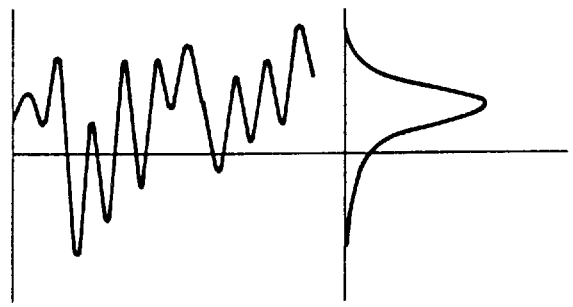
Figure 1C:
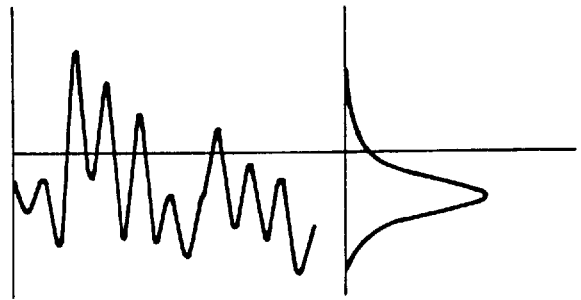

That is, as shown in FIG. 1A, when amplitude of the surface roughness is approximately symmetrical in the up and down direction, the skewness becomes zero (0). On the other hand, as shown in FIG. 1B, when the amplitude of the surface roughness deviates toward the upper direction, the skewness becomes positive (>0). Such a state shows that many convex portions exist at the surface. As shown in FIG. 1C, when the convex portions at the surface are decreased and the amplitude of the surface roughness deviates toward the downward direction, the skewness becomes negative (<0).

Figure 2:
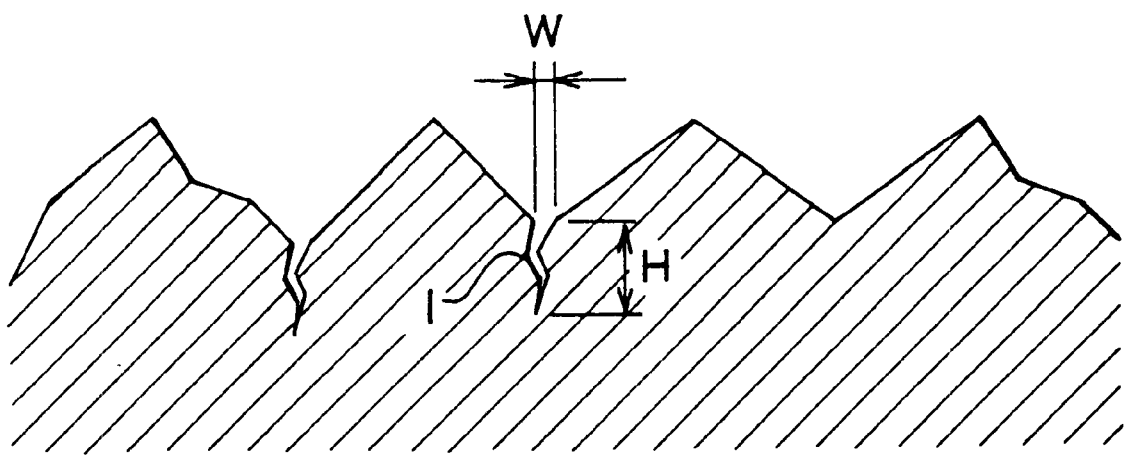
FIG. 2 is a diagram for explaining micro-crack.

A micro-crack is shown in FIG. 2, for instance. The micro-crack 1 denotes one of which width W is approximately 1 μm or less. In the present invention, the depths H of the micro-cracks are provided not to exceed 5 μm.

Thus, in the present ceramic sinter, the skewness at an contact surface is set at −2 or more and 0 or less, and the depths of the micro-cracks at the contact surface are set at 5 µm or less. Thereby, the present ceramic sinter, when used as structural member for instance, can reduce wear of the opponent member contacting therewith. In particular, when the opponent member is composed of one that is more easily worn than the ceramic sinter, for instance of metallic materials or the like, the wear can be more effectively reduced. In addition, in the case of an electronic component and circuitry being bonded, by setting the skewness of the contact surface at –2 or more and 0 or less and the depths of the micro-cracks at the contact surface at 5 µm or less, the bonding strength between the electronic component and the circuitry can be enhanced, resulting in suppression of occurrence of peeling.

In the present ceramic sinter, silicon nitride, zirconia, silicon carbide, cermet, SIALON, aluminum nitride and alumina can be used. In fabricating a structural member by use of for instance silicon nitride, zirconia, silicon carbide, cermet, or SIALON as material, the member of excellent strength, heat-resistance, endurance and corrosion-resistance can be inexpensively fabricated. The substrates can be fabricated by use of aluminum nitride, alumina and silicon nitride, thereby the substrates of excellent thermal conduction can be fabricated inexpensively.

In the ceramic sinter like this, in the range of the depth of up to 500 µm from the surface, an area that pores occupy is preferable not to exceed 5%. In the range of the depth of up to 500 µm from the surface, when the area that pores occupy exceeds 5%, the ceramic sinter deteriorates in strength and the surface thereof becomes more rough to tend to wear the opponent member. Further, when such member is used as the substrates, because of lots of pores, bonding with metal or the like becomes weaker to tend to result in damage due to peeling.

The aforementioned area that pores occupy is more preferable to be 1% or less. By implementing like this, the wear of the opponent member can be more effectively suppressed. In addition, bonding strength with an element, circuitry and a metal plate can be heightened. Further, the size of the pores like this, when averaged, is preferable to be 30 µm or less. By making the average pore size 30 µm or less, the wear of the opponent member can be furthermore decreased.

The present wear resistant member is fabricated by use of the ceramic sinter such as mentioned above and particularly characterized in that the skewness of the sliding contact surface is –2 or more and 0 or less.

In the present wear resistant member, the skewness of the sliding contact surface is set at –2 or more and 0 or less. The reason for this is as follows. When the skewness of the sliding-contact surface is more than 0, the convex portion into the surface in a distribution of surface roughness becomes larger to result in an increase of damaging power and an increase of a tendency of wearing the opponent member. The reason for setting the skewness at –2 or more is as follows. When the skewness is set at less than –2, the strength (wear resistance) of the wear resistant member itself decreases to tend to wear itself. Accordingly, the present wear resistant member, by use of the aforementioned ceramic sinter and by setting the skewness of the sliding contact surface at –2 or more and 0 or less, can remarkably reduce the wear of the opponent member. The skewness of the sliding surface is more preferable to be –1 or more and 0 or less. By implementing like this, the wear resistant member can further reduce the wear of itself (the wear resistant member) and the opponent member. The present wear resistant member may be under an excess load or an impact. Accordingly, to prevent the damage due to such load or impact from occurring, the present wear resistant member is preferable to have strength of 600 Mpa or more and fracture toughness Hv of 1300 kg/mm$^2$ or more.

The wear resistant member like this can be preferably fabricated by use of for instance silicon nitride, zirconia, silicon carbide, cermet, SIALON and alumina as materials. These materials are excellent in strength, toughness, heat resistance and corrosion resistance. Accordingly, by use of these materials for the wear resistant member, the present wear resistant member wears less the opponent member and simultaneously wears remarkably less itself. In particular, silicon nitride, being excellent in strength, toughness and wear resistance, is suitable as material of the present wear resistant member. These materials, according to demanded strength and toughness, are preferable to be appropriately selected.

The wear resistant member is preferably applied for cam rollers, bearing balls, check balls, wearing plates, plungers and rollers for instance.

A cam roller is used for a fuel injector of a diesel engine for instance to set the timing of fuel injection. The cam roller, being in high-speed contact with an inside of a cylindrical cam ring, when fabricated by use of metal, wears itself. When the existing ceramic sinter is used for a cam roller, whereas the wear of the cam roller itself can be suppressed, the cam ring is worn. When such wear happens, the timing of fuel injection becomes out of order and the prescribed function is not exhibited. By applying the present wear resistant member to the cam roller like this, the aforementioned deterioration of performance due to the wear can be suppressed.

Figure 3:
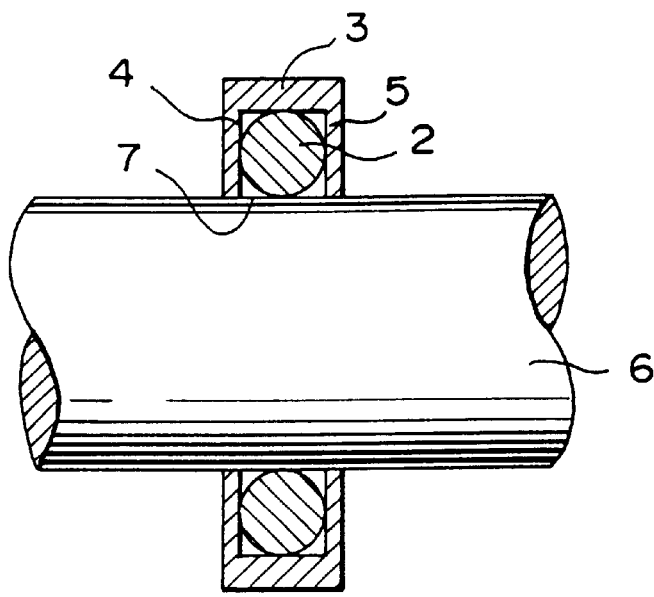
FIG. 3 is a diagram showing one example of wear resistant member of the present invention.

A bearing ball is one that is shown in FIG. 3 for instance. The bearing ball 2 of the present invention is guided by both side surfaces 4 and 5 of a bearing case 3. The bearing ball 2 is in contact with a circumference 7 of a shaft 6 with high-speed. Accordingly, these components in contact with the bearing ball 2 are under an environment liable to wear. The present bearing ball 2 can substitute for the bearing like this. Thereby, the bearing ball 2 wears less itself and the circumference 7 of the shaft 6. Accordingly, deterioration of performance of machinery due to the wear, damage or the like can be suppressed.

A check ball is made spherical and disposed in a flowmeter to measure the flow rate of a gas or the like. The check ball is in contact with an inside wall surface of the flowmeter and always repeats movement to be liable to wear itself and the inside wall surface of the flowmeter. The wear like this deteriorates accuracy of the flowmeter to result in giving inaccurate values. Accordingly, by use of the present wear resistant member to fabricate check balls, the wear like this can be prevented from occurring to result in a constant accuracy of the flowmeter.

A wearing plate is a component that slides against for instance a rocker arm of an automobile engine. By use of the present wear resistant member for the wearing plate, wear resistance can be heightened to result in realization of stable combustion and of a decrease of incomplete combustion.

A plunger is used in a fuel injector of a diesel engine and transmits movement of the cam roller, making a contact with an inside of a rotor, reciprocating with high speed. Accordingly, the plunger is very much liable to wear itself and the rotor. By applying the present wear resistant member for the plunger like this, the wear such as mentioned above can be prevented from occurring to result in an accurate fuel injection.

The present ceramic sinter can be used in electronic component member. The substrates, heat sinks or the like can be cited as an example.

Figure 4:
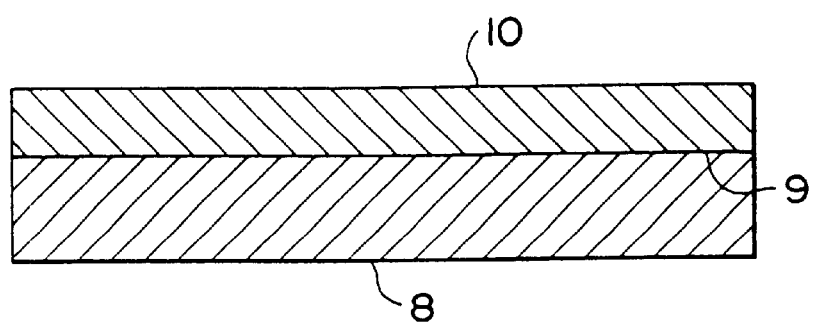
FIG. 4 is a diagram showing one example of electronic component member of the present invention.

FIG. 4 shows an example where the present electronic component member is used for the substrates. A bonding surface 9 of a substrate 8 has the skewness of −2 or more and 0 or less and depths of micro-cracks of not exceeding 5 μm. To the bonding surface 9 like this, a metal plate 10 for instance such as a Cu plate or an Al plate is bonded by use of direct bonding method. Thus, by setting the skewness of the bonding surface 9 at −2 or more and 0 or less and the depths of the micro-cracks at 5 μm or less, bonding with the metal plate or the like can be enhanced. The present electronic component member is most suitable in particular for portions where heating is repeated or temperature changes drastically. For such portions, due to the difference of thermal expansion coefficients, stress occurs to be liable to result in peeling.

For the electronic component member such as the substrate and heat sink, materials for instance such as aluminum nitride, silicon nitride and alumina can be preferably used. Recently, circuitry becomes complicated so that an amount of generated heat tends to increase accordingly. For the substrate that mounts such circuitry, one that is excellent in thermal conduction such as aluminum nitride can be preferably used. In particular, one of thermal conductivity of 60 W/m·K or more is preferable, of 130 W/m·K or more being more preferable, for the substrate and heat sink. In addition, the substrate and heat sink, being liable to undergo load in mounting the element and circuitry, are preferable to have strength of 350 MPa or more. In selecting materials for the present electronic component member, the aforementioned strength and thermal conduction are preferable to be considered.

The aforementioned ceramic sinter can be fabricated in the following way, for instance.

For instance silicon nitride powder as raw material powder, by adding yttria or the like as a sintering aide, is compounded to be a prescribed composition. This is mixed in isopropyl alcohol with silicon nitride balls for 24 hours. Thereafter, a binder is added, followed by a cold isostatic pressing (CIP) under a pressure of 1 ton to mold. The obtained molded body undergoes a degreasing process at 500° C. for 4 hours, followed by sintering at 1800° C. for 4 hours. As the molding and sintering methods like this, the known methods can be employed.

Further, the surface thereof is ground by use of diamond abrasive grains, followed by barrel tumbling or lapping. Thereby, convex portions on the surface thereof are removed to enable to attain the skewness of the ceramic sinter of −2 or more and 0 or less and the depths of the micro-cracks of 5 μm or less. The first diamond grinding can be preferably carried out by use of abrasive grains of #325 or less, more preferably by use of the abrasive grains of from #200 to #325. When the abrasive grains of less than #200 are used, grains of the matrix constituting the ceramic sinter are removed from the root thereof to result in coarse surface on the contrary. In addition, when the abrasive grains of less than #150 are used, the micro-cracks of the depths of more than 5 μm may occur. On the other hand, when the abrasive grains are too fine, it takes a long time in machining to result in inefficiency. The barrel tumbling is preferable to implement by use of a medium of relatively low hardness consisting of for instance such as alumina. Though the particle size of the medium is not particularly restricted, one of which diameter is in the range of from 3 to 10 mm is preferable. When the diameter is less than 3 mm, the ceramic sinter that is an object being processed is exposed to too weak impact, resulting in a longer processing time. On the contrary, when the medium is such large as exceeds 10 mm, the impact against the ceramic sinter that is the object becomes too large, resulting in a difficulty in enabling the skewness and the micro-cracks to be in the range of the present invention. In addition, the shape of the medium, when considering an influence of the micro-cracks to the ceramic sinter that is the object, is preferable to be spherical. By employing such a medium, the surface can be efficiently ground to enable to realize the skewness of −2 or more and 0 or less and the depths of the micro-cracks of 5 μm or less. When, as the medium, one such as silicon nitride or the like of which hardness Hv is 1300 or more is used, though the skewness of the surface can be made smaller, the surface being machined is exposed to a stronger impact to tend to form micro-cracks deeper than 5 μm or to increase an amount of micro-cracks. When the ceramic sinter like this is used, the wear of the opponent member is accelerated on the contrary.

As a preferable fabricating method in the present invention, after a first machining due to the diamond abrasive grains of #325 or less, a second machining is implemented by use of the diamond abrasive grains higher in the number by approximately #100 to 200 than that employed in the first machining. Thereafter, the barrel tumbling is preferably implemented further. As an example such as this, first the diamond grains of #270 are used to machine, thereafter the diamond grains of #400 are used to machine, followed by barrel tumbling. The machining due to the diamond abrasive grains can be repeated a plurality of times as demand arises. For instance, #325, #400, #600, - - - can be possible. By implementing a plurality of times of diamond abrasive grindings, the depth of the micro-cracks can be made smaller than approximately 1 μm.

In the present invention, according to the aforementioned methods, the ceramic sinter, wear resistant member and electronic component member of which skewness is −2 or more and 0 or less and of which depths of the micro-cracks are 5 μm or less can be fabricated.

Next, specific embodiments of the present invention and results thereof will be described.

Embodiment 1

As raw material powder, silicon nitride, yttria and alumina are employed. After granulation thereof, molding, degreasing and sintering are carried out, followed by honing against as sintered surface to obtain silicon nitride sinter (10×10×3 mm). In the present embodiment, first one or two times of machining due to the diamond abrasive grains are carried out, followed by barrel tumbling to fabricate. The first machining is carried out by use of the diamond abrasive grains of #325 or less. The second machining is carried out by use of the abrasive grains that are in the range added #200 grains to the first abrasive grains. The barrel tumbling is carried out with zirconia and alumina media. The respective media are spherical and the diameters thereof are 3 mm. Ceramic sinters consisting mainly of zirconium oxide (ZrO$_2$), silicon carbide (SiC), TiC-Ni-Mo system cermet (simply shown as cermet in Table 1), SIALON, aluminum oxide (alumina), and aluminum nitride (AlN) too undergo the processing shown in Table 1.

As a comparative example to the present invention, silicon nitride sinter is fabricated by implementing only machining due to the diamond abrasive grains of #400.

Of all the present embodiments and the comparative example, the skewness and the depth of micro-crack are measured. The results are shown in Table 1.

The values of the skewness can be obtained by use of equations 1 and 2. As for measurement device, for instance surface roughness measurement apparatus SE-3300 series by Kosaka Research Laboratory or the like can be cited. With these apparatuses, the skewness can be obtained with ease. The measurement of the micro-cracks can be implemented in the following way. A cross section of ceramic sinter that is an object being evaluated is polished, and an enlarged photograph in the neighborhood of the surface thereof is taken with an electron microscope or the like. Thereafter, the depths of the micro-cracks extending from concave portions of the unevenness of the surface are measured. In the present embodiments and the comparative example, one of which length in a direction vertical to a direction of depth is 1 μm or more is measured as the micro-crack.

TABLE 1

| No. | Main Component of Ceramic Sinter | Number of Diamond Abrasive Grain of First Time | Number of Diamond Abrasive Grain of Second Time | Medium During Barrel Tumbling | Sk | Depth of Micro-crack (μm) |
|---|---|---|---|---|---|---|
| 1-1 | $Si_3N_4$ | #180 | — | Zirconia | −2 | 5 |
| 1-2 | $Si_3N_4$ | #200 | — | Alumina | −2 | 4 |
| 1-3 | $Si_3N_4$ | #200 | #400 | Alumina | −1 | 1 |
| 1-4 | $Si_3N_4$ | #270 | — | Alumina | −1.5 | 3 |
| 1-5 | $Si_3N_4$ | #270 | #400 | Alumina | 0 | 1 |
| 1-6 | $Si_3N_4$ | #325 | — | Alumina | −1 | 3 |
| 1-7 | $Si_3N_4$ | #325 | #400 | Zirconia | −1 | 1 |
| 1-8 | $ZrO_2$ | #325 | — | Alumina | −0.5 | 2 |
| 1-9 | SiC | #325 | — | Alumina | −1 | 3 |
| 1-10 | Cermet | #325 | — | Alumina | −1 | 3 |
| 1-11 | SIALON | #325 | — | Alumina | −1 | 3 |
| 1-12 | Alumina | #325 | — | Alumina | −0.5 | 2 |
| 1-13 | AlN | #325 | — | Alumina | −0.5 | 2 |
| Comparative Example 1 | $Si_3N_4$ | #400 | — | — | +0.5 | 3 |

As obvious from Table 1, all of the present ceramic sinters have the skewness in the range of −2 or more and 0 or less. In particular, it is found that ones that have undergone two times of machining by use of the diamond abrasive grains, by further implementing the barrel tumbling, can have with ease the skewness in the range of −1 or more and 0 or less.

By contrast, all the depths of micro-cracks are 5 μm or less for the present embodiments, more than half thereof being within 3 μm.

On the contrary, in the comparative example, though the maximum depth of the micro-crack is 3 μm, the skewness is 0.5, which is out of the range of the present invention. In the comparative example, the convex portions formed during machining process are not removed by means of the barrel tumbling. That is considered to be the reason for the difference. Though not shown in Table 1, it is found that in the comparative example, in comparison with the present embodiments, more than two times of machining period is necessary.

Furthermore, the depths of almost all of the micro-cracks of the ceramic sinter of comparative example 1 are approximately 3 μm. On the other hand, in ones to which two times of machining are implemented such as sample Nos. 1–3, 1–5 and 1–7 of the embodiments, only approximately half the whole number of micro-cracks becomes the maximum depths as shown in Table 1. It is considered that due to a plurality of times of machining by use of abrasive grains that are mainly consisting of diamond, the depths of the micro-cracks are made smaller like this. That is, it is considered that due to use of coarse abrasive grains in the first machining and use of finer and finer abrasive grains in the second time and thereafter, the micro-cracks can be made smaller and can, be prevented from occurring anew. By implementing the machining like this and by further implementing the barrel tumbling, the convex portions can be cut off the surface to result in the skewness of −2 or more and 0 or less and the depths of the micro-cracks of 5 μm or less. In the present embodiment, all the widths of the micro-cracks are 1 μm or less.

Embodiment 2

Silicon nitride, yttria and alumina, raw material powder, are granulated, followed by cold isostatic pressing (rubber-pressing) under a pressure of 1 ton/cm² to mold a cylindrical body of φ12.5×26 mm, further followed by, after degreasing, sintering at 1800° C. in an atmosphere of $N_2$ to obtain a cylindrical $Si_3N_4$ sinter of density of 3.33 g/cc.

This $Si_3N_4$ sinter is machined by use of the diamond abrasive grains to form a cam roller of φ9.525±0.001× 20.15±0.001 mm.

The ceramic sinters obtained above are processed by means of wet centrifugal barrel tumbling with alumina medium to form cam rollers A, B, C and D, all of which Sk values is different. In order to evaluate, with the ceramic sinters of such different values of Sk, amounts of wear of the opponent members, these are built in fuel injection pumps of diesel engines to measure total amount of wear. For cam lobes that are opponent member, ones made of bearing steel SUJ2 are used. Tests are carried out under conditions of pressure of 1000 bar (1000 bar=100 MPa), 2000 rpm and 400 hours to evaluate.

Measurement of the amount of wear is carried out by comparing the volume of the cam roller and the cam lobe after the test and that of the cam roller and the cam lobe before the test.

As a comparative example, a cam roller E is made of steel to evaluate similarly with embodiment 1.

These results are shown in Table 2.

TABLE 2

| Sample | Sk | Total Amount of Wear of (Cam Roller + Cam Lobe) (mm³/N · mm) |
|---|---|---|
| A | −2.3 | 6.0 |
| B | −1.1 | 2.0 |
| C | −0.1 | 1.2 |
| D | 0.2 | 5.5 |
| E | 0 | 5.0 |

As shown in Table 2, among A, B and C of which values of Sk are 0 or less, for B and C the amounts of wear decease largely. Whereas in A of which Sk is less than −2 (Sk=−2.3), the amount of wear increases on the contrary. In D of which amount of wear is larger than 0 (Sk=0.2), the amount of wear becomes 5.5 mm³/N·mm to result in a higher value than that of the existing cam roller E made of steel. The unit of amount of wear of mm³/N·mm in the present invention shows a wear volume (mm³) when unit running distance (mm) is rotated while exerting prescribed load (N).

From the above results, it is found that the value of Sk is optimum to be in the range of −2 or more and 0 or less, being smaller than −2 or larger than 0 resulting in an increase of the amount of wear.

Embodiment 3

In order to investigate a permissible range of pore size distribution that affects on rolling fatigue life of a roller, in a surface and in the neighborhood of the surface, six kinds of rollers shown in Table 3 are prepared to evaluate effectiveness of these rollers as injection pump roller.

Powder is pressurized by use of uniaxitial pressing, followed by degreasing and sintering to form a roller of cylindrical body of φ12.5×26.0 mm. The skewnesses at the contact surfaces of the rollers are set at −1, areas that pores occupy being set at the values shown in Table 3 by varying the pressure of the uniaxitial pressing.

Measurements of average sizes of the pores and the areas that pores occupy are implemented in the following way. First, ceramic sinters that are objects being measured are cut at 100 μm, 300 μm and 500 μm from one end-surface thereof, followed by polishing thereof. For the respective cut samples of from the end-surface to 100 μm, from 100 μm to 300 μm, and from 300 μm to 500 μm, arbitrary three points are selected respectively, and the pore sizes and areas that pores occupy are measured for unit area (1000 μm ×1000 μm). By averaging these values, an average pore size and an average area that pores occupy are obtained. That is, in the present embodiment, by averaging over nine points (3×3=9), the average pore size and the average area that pores occupy are calculated. As for the pore size, the measured maximum diameter of each pore is regarded as a pore size. As for the number of sampling per cross section, up to the size of present embodiment, that is approximately φ12.5 ×26.0 mm, one cross section is acceptable. However, for ceramic sinter larger than that, two or three cross actions are preferable to be measured.

TABLE 3

| | Average Pore Size and Area that Pores occupy up to a Depth of 500 μm from a Surface of Axial Surface | |
|---|---|---|
| Sample | Average Pore Size (μm) | Occupying Area (%) |
| A | 10 | 1 |
| B | 20 | 0.8 |
| C | 30 | 0.4 |
| D | 30 | 0.8 |
| E | 30 | 1.5 |
| F | 40 | 0.8 |

Figure 5:
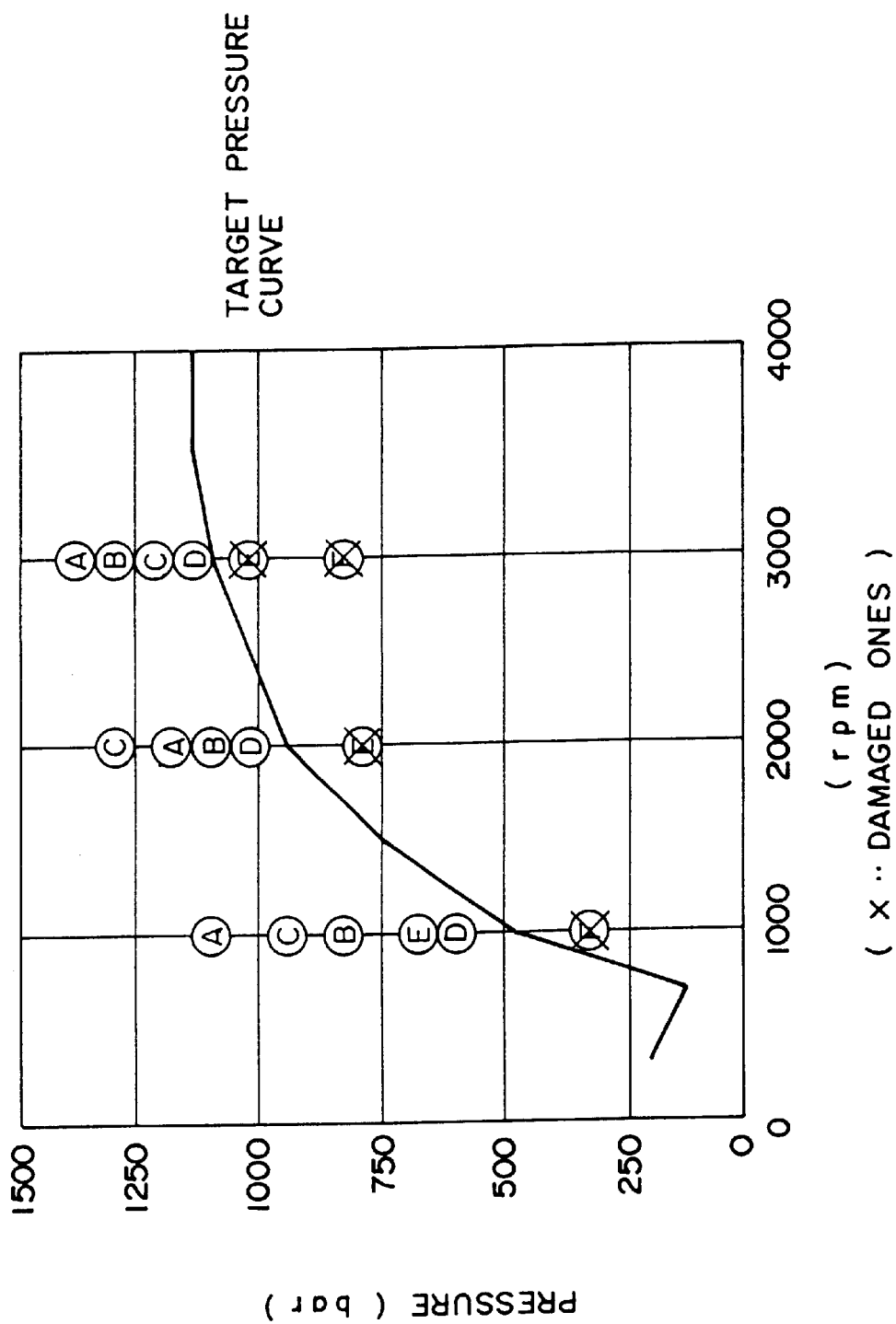
FIG. 5 is a diagram showing results of endurance test of wear resistant member of the present invention.

With six kinds of rollers thus obtained, by varying revolving speed (rpm) and pressure, endurance tests are carried out. The results of the endurance test are shown in FIG. 5.

Among C, D and E of which average pore sizes are equal, C of which area that pores occupy is the lowest shows the maximum endurance. Between D and E, except for partial exception, E of which area that pores occupy is lower shows higher endurance.

Among B, D and F of which areas that pores occupy are identical as 0.8%, B of which pore size is the smallest shows the highest endurance, followed by D and F. F of which average pore size is larger can not endure to result in damaging.

Even if the area that pores occupy is 1%, A of which average pore size is smaller shows very high endurance.

Embodiment 4

With members A and C that are employed in embodiment 3, as shown in Table 4, values of skewness are varied to measure amounts of wear. The amount of wear is measured identically with embodiment 3.

TABLE 4

| Sample | Sk | Average Pore Size (μm) | Area that Pores occupy (%) | Amount of Wear (mm³/N · mm) |
|---|---|---|---|---|
| A (Embodiment) | −1 | 10 | 1 | 2.3 |
| A' (comparative Example) | +0.3 | 10 | 1 | 6.2 |
| C (Embodiment) | −1 | 30 | 0.4 | 5.6 |
| C' (Comparative Example) | +0.3 | 30 | 0.4 | 5.6 |

As shown in Table 4, it is found that even if the average pore sizes and areas that pores occupy are equal, due to whether the skewness is negative or positive, there occurs a great difference between the amounts of wear of itself and the opponent member. As obvious from the above results, it is found that by controlling both the skewness and the pore size as shown in the present embodiment, as a synergetic effect, the wear-resistance can be further heightened.

Embodiment 5

In order to investigate an influence of the skewness of the substrate surface on bonding strength, to AlN substrates of different skewness, copper plates are bonded by means of direct bonding method (DBC method) to measure peel strength.

As shown in Table 5, AlN substrates of which skewness are set at 0 or −1 are used for embodiments and AlN substrate of which skewness is +0.5 is used for a comparative example. The dimension of AlN substrates is such as height of 50 mm×width of 25 mm×thickness of 0.8 mm, copper plate being tough pitch copper of a thickness of 0.25 mm. By maintaining these for 1 min in a heating furnace set at a temperature of 1075° C., the AlN substrate and the copper plate are bonded.

TABLE 5

| | Sk | Peel Strength |
|---|---|---|
| Embodiment 5-1 | 0 | 4.0 |
| Embodiment 5-2 | −1 | 6.5 |
| Comparative Example 5 | +0.5 | 3.2 |

As shown in Table 5, ones of which skewness are in the range of the present invention, compared with the comparative example, are excellent in bonding strength with copper plate. In particular by setting the skewness at −1, the bonding strength can be remarkably heightened.

Industrial Applicability

As detailed above, in the present ceramic sinter, the skewness at the contact surface thereof is made in the range of −2 or more and 0 or less and the depths of the micro-cracks formed at the contact surface are made 5 μm or less. By setting the skewness at the contact surface −2 or more and 0 or less and the depths of the micro-cracks 5 μm or less, in employing as a structural material, the wear of itself can be suppressed and the wear of the opponent member can also be suppressed. In employing it as the electronic component member, bonding strength with the metal plate or the like can be heightened to result in suppression of peeling of the metal plate or the like.

In the present wear resistant member, in particular by setting the skewness of the sliding contact surface at −2 or more and 0 or less, the wear of the opponent member can be further suppressed, thereby machinery of high endurance can be manufactured.

In the present electronic component member, by setting the skewness at the component mounting surface or the circuitry formation surface in the range of −2 or more and 0 or less, for instance element and metal plate are suppressed from peeling, resulting in manufacturing of electronic components of excellent reliability.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

What is claimed is:

1. A wear resistant member comprising a ceramic sinter, said ceramic sinter comprising a contact surface that slides on a surface of other member:

wherein the ceramic sinter is a silicon nitride, zirconia, silicon carbide, cermet or SIALON sinter, and the contact surface is controlled such that a skewness of the sliding contact surface is in the range of −1.0 to 0, and a depth of a micro-crack formed at the sliding contact surface is 5 μm or less.

2. The wear resistant member as set forth in claim 1:

wherein the wear resistant member is at least one selected from the group consisting of a cam roller, a bearing ball, a check ball, a wearing plate, a plunger and a roller.

3. The wear resistant member as set forth in claim 1:

wherein a hardness Hv of the ceramic sinter is 1300 Kg/mm$^2$ or more.

4. The wear resistant member as set forth in claim 1:

wherein a strength of the ceramic sinter is 600 MPa or more.

5. The wear resistant member as set forth in claim 1:

wherein in the range of a depth of up to 500 μm from the sliding contact surface, an area that pores occupy is not more than 1%.

6. The wear resistant member as set forth in claim 1:

wherein the depth of a micro-crack formed at the sliding contact surface is 1 μm or less.

7. The wear resistant member as set forth in claim 1, wherein the contact surface is obtained by grinding with diamond abrasive grains followed by barrel tumbling or lapping.

8. The wear resistant member as set forth in claim 7, wherein the grinding is carried out at least two times, the first grinding being carried out with abrasive grains having a first grain size of #325 or less, and wherein a second grinding is carried out with abrasive grains having a second grain size larger than the first grain size.

9. The wear resistant member as set forth in claim 6, wherein the wear resistant member is selected from the group consisting of a cam roller, a bearing ball, a check ball, a wearing plate, a plunger and a roller.

* * * * *